US006161283A

United States Patent [19]

Tokuwa

[11] Patent Number: 6,161,283

[45] Date of Patent: Dec. 19, 2000

[54] CONNECTOR FOR CIRCUIT BOARD AND METHOD FOR PRODUCING A CONNECTOR

[75] Inventor: Koichiro Tokuwa, Yokkaichi, Japan

[73] Assignee: Sumitomo Wiring Systems, Ldt., Japan

[21] Appl. No.: 09/307,212

[22] Filed: May 7, 1999

Related U.S. Application Data

[62] Division of application No. 09/088,882, Jun. 2, 1998, Pat. No. 6,068,494.

[30] Foreign Application Priority Data

Jun. 30, 1997 [JP] Japan .................................... 9-174635

[51] Int. Cl.[7] ........................................ H05K 3/30

[52] U.S. Cl. ................................ 29/882; 29/883; 29/884; 29/876; 439/79

[58] Field of Search .............................. 29/876, 882, 883, 29/884; 439/79, 80

[56] References Cited

U.S. PATENT DOCUMENTS

| | | | |
|---|---|---|---|
| 4,488,355 | 12/1984 | Hutchins et al. | 29/884 X |
| 4,491,376 | 1/1985 | Gladd et al. . | |
| 4,697,864 | 10/1987 | Hayes et al. . | |
| 4,966,556 | 10/1990 | Reymond et al. . | |
| 5,439,385 | 8/1995 | Sakai et al. . | |
| 5,490,787 | 2/1996 | Bowman et al. . | |
| 5,511,984 | 4/1996 | Olson et al. . | |
| 5,676,554 | 10/1997 | Tsuji . | |
| 5,827,077 | 10/1998 | Fukuda . | |
| 5,863,222 | 1/1999 | Kinsey, Jr. et al. . | |

FOREIGN PATENT DOCUMENTS

| | | |
|---|---|---|
| 8-273773 | 10/1996 | Japan . |
| 8-315930 | 11/1996 | Japan . |

*Primary Examiner*—Lee Young
*Assistant Examiner*—Rick Kiltae Chang
*Attorney, Agent, or Firm*—Anthony J. Casella; Gerald E. Hespos; Michael J. Porco

[57] ABSTRACT

A connector is provided to make terminal fittings unlikely to be struck against external matter. The connector is for use with a circuit board in which terminal fittings are bent downward after being pulled backward of a connector housing 1 so as to be connectable with a circuit board 5, protection walls including an upper protection wall 10 extend behind the connector housing 1 to surround the terminal fittings 2 lest the terminal fittings 2 should project. Thus, the protection walls prevent the terminal fittings 2 from being directly struck by an external matter. Furthermore the invention relates to an improved method for producing a connector.

6 Claims, 4 Drawing Sheets

CONNECTOR FOR CIRCUIT BOARD AND METHOD FOR PRODUCING A CONNECTOR

This application is a divisional of application Ser. No. 09/088,882 filed Jun. 2, 1998 now U.S. Pat. No. 6,068,494.

BACKGROUND OF THE INVENTION

1. Field of the Invention

The present invention relates to a connector for a circuit and is designed particularly to make terminal fittings less susceptible to deformation and damage from the outside. Furthermore the present invention relates to a method for producing a connector for a circuit board, having substantially bent terminal fittings.

2. Description of the Prior Art

FIG. 6 shows a prior art connector for a circuit board, in which a receptacle 31 into which a mating housing is fittable is formed at a front part of a housing 30. A plurality of terminal fittings 32 are pressed into the inner wall of the housing 30. One end of each terminal fitting 32 projects into the receptacle 31, and the other end extends straight backwardly of the housing 30 and then is bent downwardly. The back ends of the terminal fittings 32, if necessary, are inserted through an unillustrated alignment plate mounted on the housing 30 for positioning in the terminal fittings. In this state, the connector is conveyed to a place of operation for connection with a circuit board. In this connection process, the back ends of the respective terminal fittings 32 are inserted into through holes formed in an unillustrated circuit board and are soldered to conductive regions on the circuit board.

The respective terminal fittings 32 are bent as shown in FIG. 7 after being pressed into the wall of the housing 30. First, the housing 30 with the terminal fitting 32 mounted thereon is set in a positioning jig 35. At this time, a receiving portion 36 is located below a specified bend location of the terminal fittings 32, and portions thereof which are more toward the ends than these specified bend locations are not supported at all. Subsequently, a bending jig 37 is lowered toward the portions of the terminal fittings 32 to be bent. The terminal fittings 32 then are bent substantially at right angles about the specified bend locations as indicated in phantom line in FIG. 7.

The above bending operation is premised on the prior art connector design. Therefore the housing 30 needs to be so formed as to leave an open space behind and above the receptacle 31 to avoid interference with the bending jig 37. This prior art design requires the ends of the respective terminal fittings 37 adjacent the specified bend location to be exposed upwardly, with the result that the terminal fittings 32 may be deformed upon being subjected to an external force. Even in the case where the terminal fittings 37 are positioned by the alignment plate as described above, if an external force acts, for example, on the bent portions of the terminal fittings 37, the leading ends of the terminal fittings 37 may be opened wider, thereby making the connection with the circuit board 34 difficult.

The present invention was developed in view of the problems residing in the prior art, and an object thereof is to provide a connector for a circuit board which can prevent terminal fittings from being damaged. Furthermore it is an object of the invention to provide an improved method for producing a connector.

SUMMARY OF THE INVENTION

According to the invention, there is provided a connector for a circuit board, in which terminal fittings are mounted to project substantially backwardly from a connector housing that is to be fixed to a circuit board. The projecting portions of the terminal fittings are bent at an angle different from 0° or 180°, and preferably substantially normal to a longitudinal direction thereof in intermediate positions and are formed at their leading ends with mount portions to be fixed to the circuit board. At least one protection wall extends from the connector housing and substantially covers or protects the backwardly projecting portions of the terminal fittings. Accordingly, the connector can prevent the unwanted bending of the terminal fittings from a lateral direction, e.g. during shipping.

According to a preferred embodiment of the invention, the protection wall is an upper protection wall for substantially covering the backwardly projecting portions of the terminal fittings substantially from a lateral direction arranged at an angle different from 0° or 180°, with respect to a longitudinal direction of the projecting portions, and preferably between about 40° and about 140°. Thus the protection wall protects the backwardly projecting portions of the terminal fittings against contact from above. Preferably, portions of the terminal fittings that are bent downwardly are formed at their leading ends with mount portions to be inserted into through holes of the circuit board. The upper protection wall may cover the mount portions of the backwardly projecting portions of the terminal fittings from above. Accordingly, since the backwardly projecting bent portions of the terminal fittings mounted on the connector housing are covered from above by the upper protection wall, they are unlikely to be damaged by an external force.

An open space substantially behind the connector housing is a jig insertion space for the insertion and withdrawal of at least a part of a bending jig for the terminal fittings. Accordingly, the terminal fittings inserted into the connector housing may be bent by the bending jig inserted through the jig insertion space behind the connector housing.

According to a further preferred embodiment, the connector housing comprises a plurality of protection walls for substantially covering the backward projecting portions of the terminal fittings from substantially all lateral directions except the direction of a mount side of the connector housing at which a mount plate and/or the circuit board may be mounted. In this context, the lateral direction is arranged substantially normal to the longitudinal direction of the projecting portions and/or the lateral direction is substantially parallel to a second longitudinal direction of the mount portions. Accordingly, the projecting portions of the terminal fittings can be efficiently protected against damage.

The terminal fittings may be mounted on or in the connector housing by means of a terminal support wall adjacent to a connector receptacle for receiving a mating connector. The terminal support wall may project in a direction substantially parallel to the projecting portion for forming one or more restricting portions that restrict lateral bending of the projecting portion.

According to the invention, there is further provided a method for producing a connector for a circuit board, having substantially bent terminal fittings. The method comprises the step of positioning one or more terminal fittings in a connector housing such that a forward or first portion thereof projects into a connector receptacle and such that a backward or second projecting portion thereof extends into a jig insertion space. The method proceeds by inserting a bending jig into a jig insertion space along a direction substantially parallel to the extending direction of the projecting portion of the terminal fittings such that the backwardly projecting portion is inserted at least partially into a receiving groove of the bending jig. The method then includes rotating and/or displacing the bending jig such that the terminal fitting is bent in a direction at an angle different from 0° or 180°, and preferably substantially normal to the projection direction of the projecting portion. Accordingly, prior art problems encountered in bending the terminal fittings are solved efficiently.

According to a preferred embodiment of the invention, the backwardly projecting portion is inserted into a receiving groove of the bending jig by a length corresponding to the length of the portion of the terminal fittings to be bent, and the receiving groove preferably has a depth corresponding to the length.

Preferably, the method further comprises the step of covering the terminal fittings from a lateral direction arranged at an angle different from 0° or 180°, preferably between about 40° and about 140°, with respect to a longitudinal direction of the projecting portions by forming at least one protection wall extending from the connector housing.

These and other objects, features and advantages of the present invention will become more apparent upon a reading of the following detailed description and accompanying drawings.

DETAILED DESCRIPTION OF THE PREFERRED EMBODIMENT

A connector for a circuit board according to the invention is illustrated in FIGS. 1–5. The connector comprises a connector housing 1 having a plurality of male terminal fittings 2 of at least two different lengths.

Figure 2:
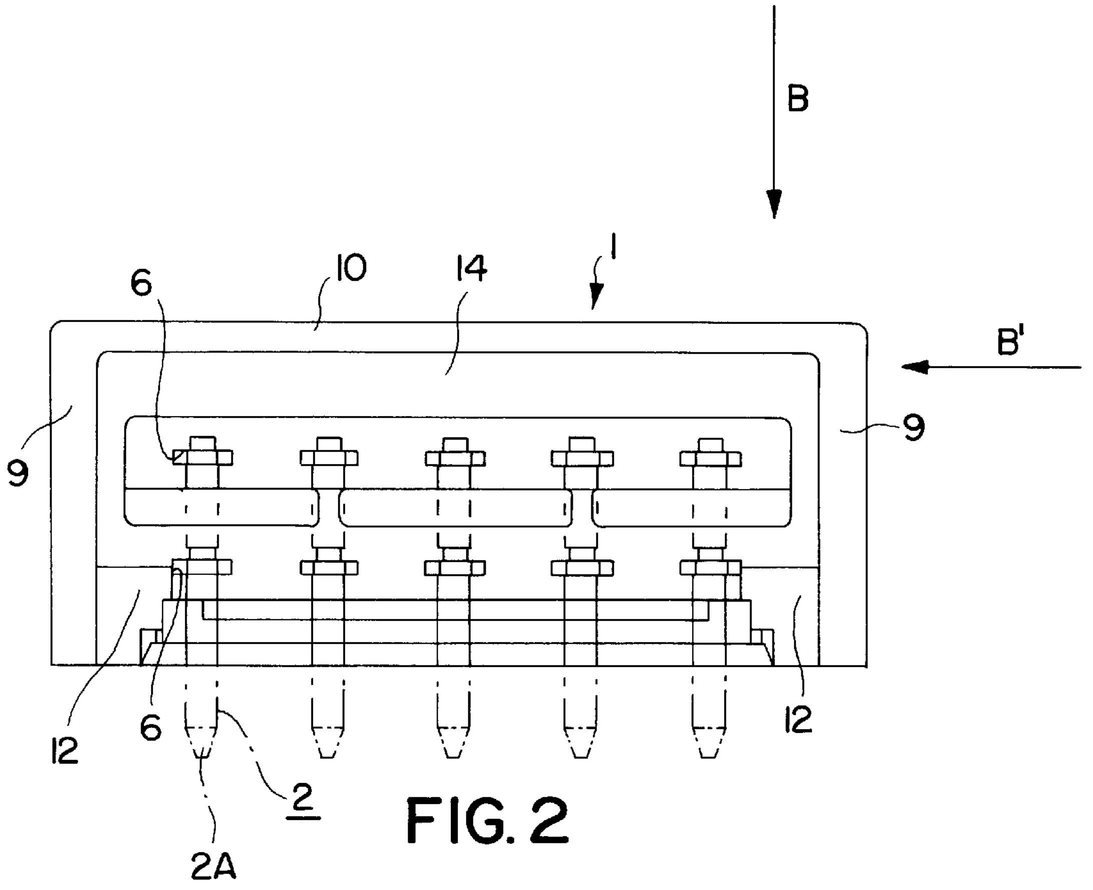
FIG. 2 is a rear view of the connector before an alignment plate is mounted.

The connector housing 1 is made, for example, of a synthetic resin material and has a substantially block-like shape that is dimensioned and configured to be closely fixed to a surface of a circuit board 5. At a front part of the connector housing 1 is formed a substantially rectangular tubular receptacle 3 into which an unillustrated mating connector housing is fittable or insertable. Further, a plurality of press holes 6 are formed preferably side by side along the widthwise direction of the connector housing 1 at each of upper and lower levels in a terminal support wall 4 of the connector housing 1. In this embodiment, five each of press holes 6 are formed on each of the upper and lower levels as shown in FIG. 2. A terminal support wall 4 preferably substantially closes the tubular receptacle 3 in a longitudinal direction A of the terminal fittings 2 or a mating direction A of the unillustrated mating female connector.

The male terminal fittings 2 are mounted or mountable by being pressed or inserted or arranged through the respective press holes 6. The male terminal fittings 2 mounted on the upper level are substantially longer than those mounted on the lower level. These upper male terminal fittings 2 have portions that extend along a direction of mating A into the receptacle 3. or horizontally project into the receptacle 3. Portions of the upper male terminal fittings 2 that project beyond the press holes 6 define engaging portions which are substantially parallel to each other and have substantially the same length. These engaging portions are brought or bringable into contact with unillustrated female terminal fittings that are inserted in a mating direction A when the connector housing 1 is engaged with the mating connector housing 1.

On the other hand, portions 2B of the male terminal fittings 2 that project rearwardly from the terminal support wall 4 are bent at angles different from 0° or 180°, preferably substantially at right angles in a manner to be described later. The leading ends of these bent regions serve as mount portions 2A to the circuit board 5. The mount portions 2A are inserted into through holes or recesses 7 in the circuit board 5 and are secured to the circuit board 5 by unillustrated solder, clamps or the like fixing means.

In this embodiment, the opening edges of the upper press holes 6 and/or the terminal support wall 4 project backwardly or in a direction away from the receptacle behind the terminal support wall 4 of the connector housing 1, forming restricting projections 8 which receive the supported side of the male terminal fittings 2 over a specified or predetermined or predeterminable length. In this way, the deformation of the male terminal fittings 2 is prevented at their supported side or their end opposite portions that project into the receptacle 3.

Figure 1:
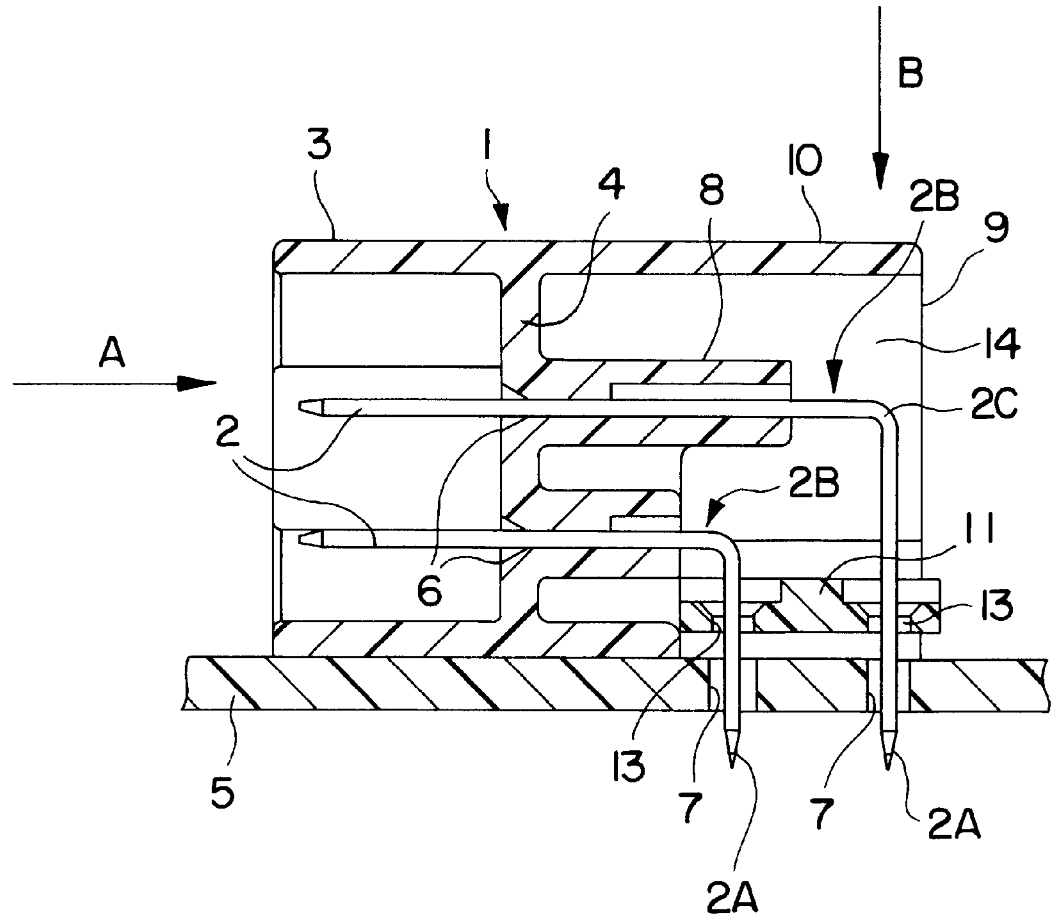
FIG. 1 is a side view in section of a connector.

Further, a pair of side protection walls 9 and an upper protection wall 10 are formed to substantially surround the respective male terminal fittings 2 at a rear part or portion of the connector housing 1. These protection walls 9, 10 are formed to be substantially flush with the connector housing 1, and have such lengths that the rear edges thereof are located more outside or backwardly from the rear edges of the upper male terminal fittings 2. In other words, the rear part of the connector housing 1, except the rear and lower surfaces, is covered substantially by the protection walls 9, 10. Thus the respective terminal fittings 2 are protected from damage by external matter hitting the rear part or projecting part 2B of the terminal fittings 2 from a lateral direction B, as shown in FIGS. 1 and 2 or direction B', as shown in FIG. 2. Additionally, the protection walls 9, 10 protect against contact approaching the terminal fittings 2 at a broad range of angles different from 0° or 180° with respect to the mating direction A or longitudinal direction of the projecting portions 2B, and preferably forces substantially normal thereto. The protection wall 10 preferably protects the projecting portions 2B of the terminal fittings 2 projecting backwardly from the terminal support wall 4 from being hit or damaged from a direction B substantially opposed to the longitudinal direction of the mount portion 2A of the terminal fittings 2.

At an opening formed at a lower part of the connector housing 1 is mounted an alignment plate 11 for aligning the mount portions 2A of the respective male terminal fittings 2. The alignment plate 11 has a substantially platelike shape and has its side edges engaged with arm portions 12 (FIG. 2) projecting at the bottom and/or lateral portion of the rear surface of the connector housing 1, preferably from below, and is held by an unillustrated locking means. The alignment plate 11 is formed with positioning holes 13 corresponding to the mount portions 2A of the terminal fittings 2. The mount portions 2A are aligned so as to substantially conform to the through holes 7 of the circuit board 5 by being inserted through or fitted in the positioning holes 13.

Figure 3:
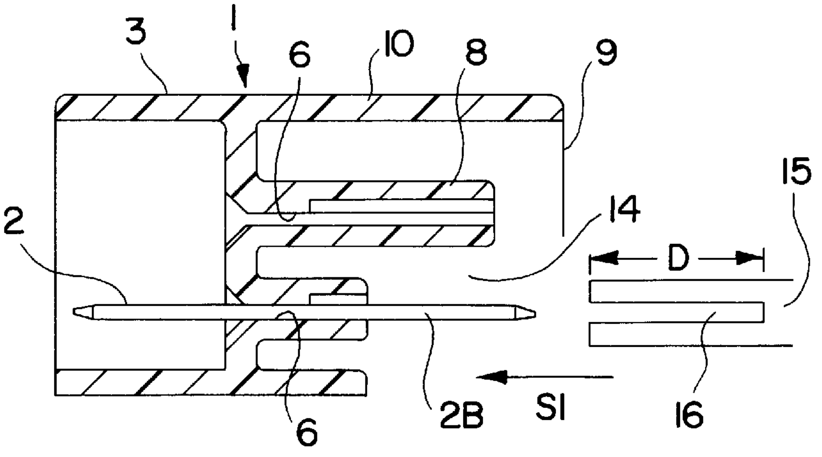
FIG. 3 is a side view in section showing a state at the start of a terminal fitting bending operation.
Figure 4:
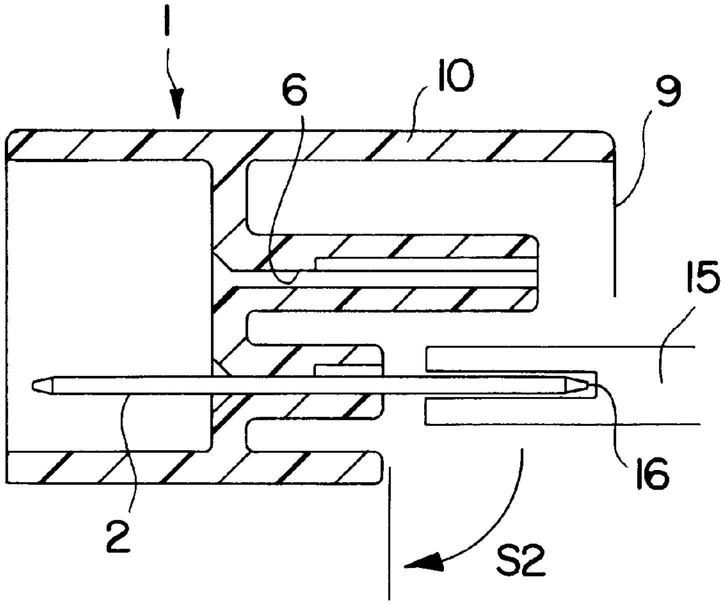
FIG. 4 is a side view in section showing a state during the insertion of a jig.
Figure 5:
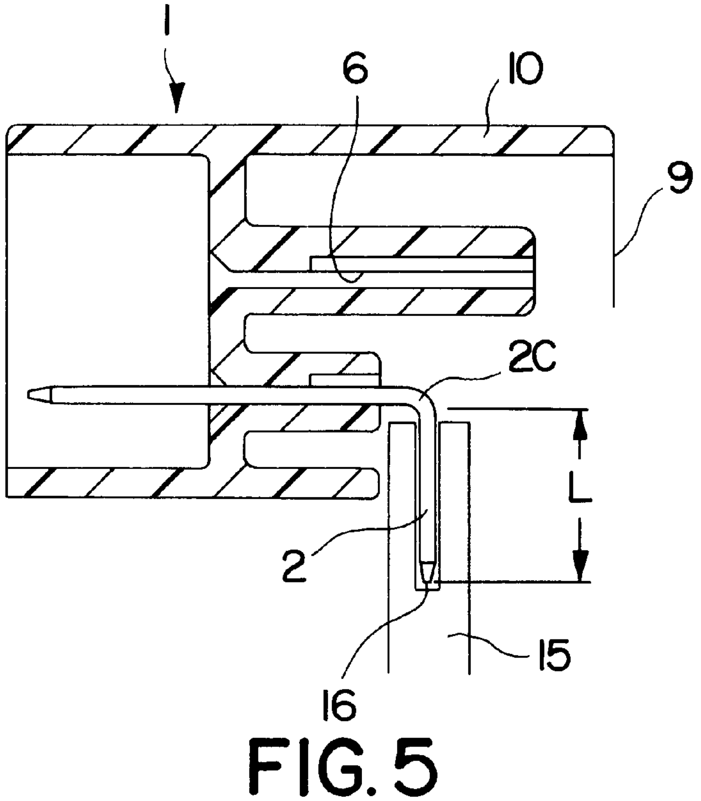
FIG. 5 is a side view in section showing a state during the bending operation.
Figure 6:
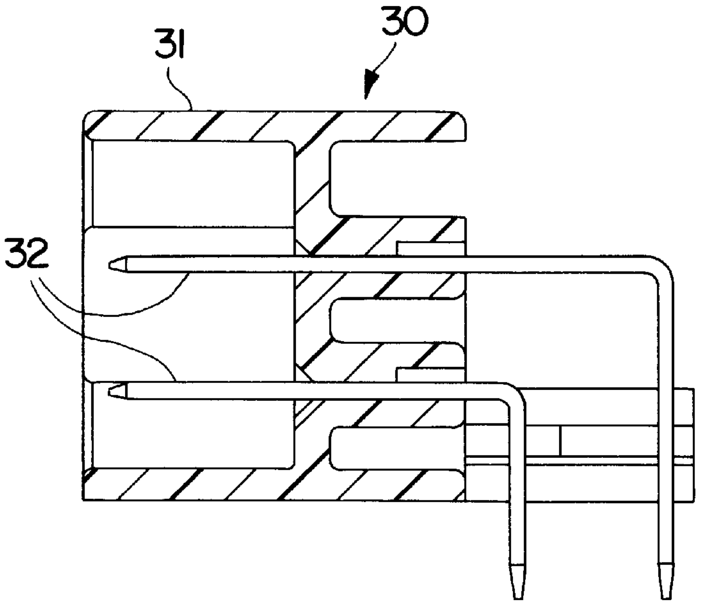
FIG. 6 PRIOR ART
FIG. 6 is a side view in section of a prior art connector for a circuit board.
Figure 7:
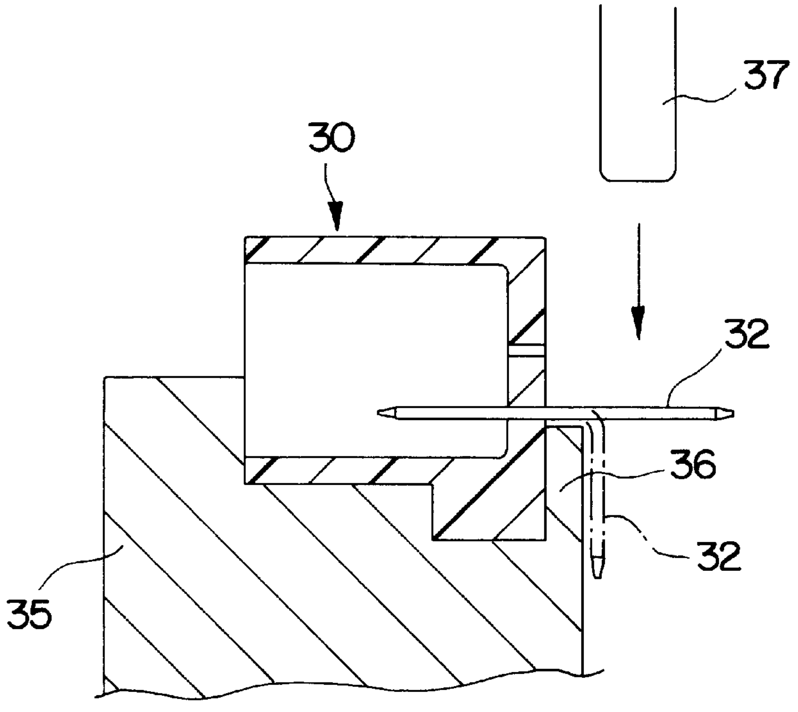
FIG. 7 PRIOR ART
FIG. 7 is a side view in section showing a bending operation of the prior art connector.

An opening at the rear side of the connector housing 1 serves as an insertion space 14 for a jig 15 for bending the male terminal fittings 2. The male terminal fittings 2 are bent as shown in FIGS. 3 to 5. Although the bending of the lower male terminal fittings 2 is shown in FIGS. 3–5, the upper male terminal fittings 2 are bent in a similar manner by providing a corresponding insertion space 14.

The bending jig 15 is formed at its leading end with a receiving groove 16 into which the male terminal fitting 2 is at least partially insertable or fittable, and the depth D of the groove 16 at least substantially corresponds to the length L (FIG. 5) between the rear ends of the male terminal fittings 2 and portions 2C thereof to be bent. Preferably the depth D is substantially equal to the length L. Accordingly, before the bending operation, the bending jig 15 is entered into the jig insertion space 14 preferably substantially from behind (arrow S1) the male terminal fitting 2 (state of FIG. 3) until the rear end of the male terminal fitting 2 reaches the corresponding insertion depth, preferably substantially the bottom end of the receiving groove 16 (state of FIG. 4). At this stage the insertion depth substantially corresponds to the length L. The bending jig 15 then is rotated or displaced (arrow S2) by an angle different from 0° or 180°, and preferably substantially by 90°. The bending may be carried out by hand or an automatic machine. In this way, the male terminal fitting 2 is bent in its set position. If the respective male terminal fittings 2 are repeatedly bent in the aforementioned manner, the terminal fitting bending operation is completed.

The alignment plate 11 then is secured to the arm portions 12 of the connector housing 1 such that the mount portions 2A of the male terminal fittings 2 are inserted in the respective positioning holes 13, to complete the assembly of the connector for the circuit board. Thereafter, by inserting the mount portions 2A into the through holes 7 of the circuit board 5 and performing soldering or the like, the securing of the connector to the circuit board 5 is completed. Preferably the alignment plate 11 laterally substantially closes the rear portion of the connector housing 1 such that the terminal fittings 2 do not project outside of the connector housing 1 along a longitudinal direction thereof or a mating direction A (or backward direction).

As described above, according to this embodiment, the upper protection wall 10 is formed in addition to the side protection walls 9 to surround the respective male terminal fittings 2 so as not to project sideways. Accordingly, the deformation of the male terminal fittings 2 by external matter during the transportation of the connectors can be prevented. Thus, when the connector is mounted on the circuit board 5, the alignment interval of the respective mount portions 2A is held proper, thereby eliminating a likelihood that the mount portions 2A are brought out of alignment. Therefore, the connector can be smoothly mounted on the circuit board.

Since the space above the portions of the terminal fittings to be bent is closed by the upper protection wall 10 in this embodiment, the conventional method for bending the terminal fittings from above cannot be adopted. However, by adopting a new method of inserting the jig sideways, the problem in the bending can be overcome.

It should be noted that a variety of changes can be made to the present invention and that the following modification is also embraced by the technical scope of the present invention as defined in the claims. In the foregoing embodiment, the male terminal fittings 2 are arranged on two levels at the rear surface of the connector housing 1. However, the number of levels and the number of terminal fittings to be arranged side by side are not limited.

What is claimed is:

1. The method for producing a connector for a circuit board, comprising the steps of:

providing a connector housing having a bottom wall for mounting to the circuit board, a terminal support wall projecting upwardly from the bottom wall, terminal press holes extending through the support wall substantially parallel to the bottom wall, connector receptacle walls above the bottom wall and projecting in a forward direction from the terminal support wall to define a connector receptacle for receiving a mating connector, a top protection wall and a pair of side protection walls extending rearwardly from the terminal support wall and rearwardly beyond the bottom wall for defining a jig insertion space with an open bottom;

providing a plurality of substantially linear terminal fittings, each said terminal fitting having a mating end and a board mounting end;

inserting the terminal fittings through the respective press holes in the terminal support wall such that the mating ends of the respective terminal fittings project into the connector receptacle and such that each said terminal fitting has a backwardly projecting portion that projects linearly and backwardly from the terminal support wall into the jig insertion space;

providing a bending jig having a leading end and a receiving groove extending into the leading end, the receiving groove being dimensioned to receive at least part of the backwardly projecting portion of each said terminal fitting;

inserting the bending jig into the jig insertion space along a direction substantially parallel to the backwardly projecting portion of the terminal fittings such that the backwardly projecting portion is inserted at least partially into the receiving groove of the bending jig; and rotating the bending jig about an axis substantially adjacent the leading end of the bending jig and in a direction toward the bottom wall, such that the board mounting end of each said terminal fitting projects below the bottom wall of the connector housing for mounting each said terminal fitting to the circuit board.

2. The method according to claim 1, wherein the bottom wall has a bottom surface substantially parallel to and spaced from portions of said terminal fittings in said press holes by a specified distance, the backwardly projecting portion being inserted into the receiving groove of the bending jig by a length that exceeds the specified distance between the bottom surface of the bottom wall and the terminal fitting.

3. The method according to claim 1, wherein the step of inserting the bending jig comprises inserting the bending jig to a location where the leading face of the bending jig is within the jig insertion space and spaced from the terminal support wall.

4. The method according to claim 3, wherein the bending jig has a bottom wall adjacent the receiving groove, the bottom wall of the bending jig having a selected thickness, the step of inserting the bending jig into the jig insertion space being carried out until the leading end of the bending jig is spaced from the terminal support wall by a distance at least equal to the thickness of the bottom wall of the bending jig.

5. The method according to claim 1, further comprising steps of providing an alignment plate having a plurality of apertures formed therethrough for receiving portions of the respective terminals, and mounting the alignment plate to the connector housing such that portions of each said terminal fitting adjacent the board mounting ends thereof project through the apertures in the alignment plate.

6. The method according to claim 5, wherein the step of mounting the alignment plate comprises mounting the alignment plate between the side protection walls.

* * * * *